(12) United States Patent
Jung et al.

(10) Patent No.: US 12,356,775 B2
(45) Date of Patent: Jul. 8, 2025

(54) DISPLAY DEVICE INCLUDING LIGHT EMITTING ELEMENTS OVERLAPPING LIGHT ABSORBING LAYER

(71) Applicant: Samsung Display Co., LTD., Yongin-si (KR)

(72) Inventors: Eui Suk Jung, Seoul (KR); Tae Gyun Kim, Hwaseong-si (KR); Jun Hong Park, Suwon-si (KR); Ki Beom Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 947 days.

(21) Appl. No.: 17/494,472

(22) Filed: Oct. 5, 2021

(65) Prior Publication Data
US 2022/0223768 A1 Jul. 14, 2022

(30) Foreign Application Priority Data
Jan. 14, 2021 (KR) .......................... 10-2021-0005304

(51) Int. Cl.
*H10H 20/855* (2025.01)
*H10H 20/815* (2025.01)
(Continued)

(52) U.S. Cl.
CPC ........ *H10H 20/855* (2025.01); *H10H 20/815* (2025.01); *H10H 20/8312* (2025.01); *H10H 20/857* (2025.01); *H01L 25/0753* (2013.01)

(58) Field of Classification Search
CPC ....... H01L 33/58; H01L 33/12; H01L 33/382; H01L 33/62; H01L 25/0753;
(Continued)

(56) References Cited

U.S. PATENT DOCUMENTS

2010/0148192 A1* 6/2010 Jung .................. H10K 59/8792
257/59
2010/0200868 A1* 8/2010 Masui .................. H01S 5/0264
257/82
(Continued)

FOREIGN PATENT DOCUMENTS

KR 10-2019-0029831 3/2019
KR 10-2020-0006651 1/2020
KR 10-2020-0063386 6/2020

*Primary Examiner* — Lex H Malsawma
(74) *Attorney, Agent, or Firm* — KILE PARK REED & HOUTTEMAN PLLC

(57) ABSTRACT

A display device includes a buffer layer on a substrate and including an opening in a first region, a gate insulating layer on the buffer layer and including an opening in the first region, a first conductive layer on the gate insulating layer in a second region, a first interlayer insulating layer on the first conductive layer and including an opening in the first region, a second conductive layer on the first interlayer insulating layer in the second region, a light absorbing layer on the second conductive layer, a third conductive layer d on the light absorbing layer and including a first electrode and a second electrode, and a first voltage wire on the light absorbing layer, a first insulating layer overlapping the third conductive layer; and light emitting elements on the first insulating layer in the first region.

20 Claims, 18 Drawing Sheets

(51) Int. Cl.
*H10H 20/831* (2025.01)
*H10H 20/857* (2025.01)
*H01L 25/075* (2006.01)

(58) Field of Classification Search
CPC ............... H10H 20/855; H10H 20/857; H10H 20/8312; H10H 20/815
See application file for complete search history.

(56) References Cited

U.S. PATENT DOCUMENTS

| | | | |
|---|---|---|---|
| 2012/0104430 A1* | 5/2012 | Kim | H10K 50/854 |
| | | | 257/91 |
| 2016/0233291 A1* | 8/2016 | Lim | H01L 33/005 |
| 2019/0363284 A1* | 11/2019 | Yasuda | H10K 50/844 |
| 2020/0403029 A1* | 12/2020 | Kim | H01L 27/156 |

\* cited by examiner

T1: ACT1, G1, S1, D1

T1: ACT1, G1, S1, D1

T1: ACT1, G1, S1, D1

DISPLAY DEVICE INCLUDING LIGHT EMITTING ELEMENTS OVERLAPPING LIGHT ABSORBING LAYER

CROSS-REFERENCE TO RELATED APPLICATION(S)

This application claims priority to and benefits of Korean Patent Application No. 10-2021-0005304 under 35 U.S.C. § 119 filed on Jan. 14, 2021 in the Korean Intellectual Property Office, the entire contents of which are incorporated herein by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like have been implemented.

A display device is a device for displaying an image, and may include a display panel, such as an organic light emitting display panel or a liquid crystal display panel. The light emitting display panel may include light emitting elements, for example, light emitting diodes (LED), and examples of the light emitting diode include an organic light emitting diode (OLED) using an organic material as a fluorescent material and an inorganic light emitting diode using an inorganic material as a fluorescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device including an inorganic light emitting element and capable of reducing the reflection of external light and internal light.

However, aspects of the disclosure are not restricted to the ones set forth herein. The above and other aspects of the disclosure will become more apparent to one of ordinary skill in the art to which the disclosure pertains by referencing the detailed description of the disclosure given below.

The display device according to an embodiment may include a light absorbing layer BM capable of allowing a part of light emitted from the light emitting element to be smoothly emitted upward, while preventing the other part thereof and external light from being reflected by conductive layers. Accordingly, the display device may improve visibility by preventing the reflection of internal light and external light.

It should be noted that the effects of the disclosure are not limited to those described above, and other effects of the disclosure will be apparent from the following description.

According to an embodiment, a display device may include a substrate including a first region and a second region; a buffer layer disposed on the substrate and including an opening in the first region; a gate insulating layer disposed on the buffer layer and including an opening in the first region; a first conductive layer disposed on the gate insulating layer in the second region; a first interlayer insulating layer disposed on the first conductive layer and including an opening in the first region; a second conductive layer disposed on the first interlayer insulating layer in the second region; a light absorbing layer disposed on the second conductive layer in the first region and the second region; a third conductive layer disposed on the light absorbing layer and comprising a first electrode and a second electrode spaced apart from each other in the first region; and a first voltage wire disposed on the light absorbing layer and disposed in the second region; a first insulating layer disposed in the first region and the second region overlapping the third conductive layer; and light emitting elements disposed on the first insulating layer in the first region.

The light absorbing layer may include a black matrix material.

The light absorbing layer may be disposed in and directly contacts the first region on the substrate.

A height of a portion of the light absorbing layer disposed in the first region, measured from the substrate, may be less than a height of a portion of the light absorbing layer disposed in the second region, measured from the substrate.

The light emitting elements may overlap the light absorbing layer in a thickness direction.

The light absorbing layer may be disposed on an inner sidewall of the first region in which the buffer layer, the gate insulating layer, and the first interlayer insulating layer are opened, and may be in direct contact with the buffer layer, the gate insulating layer, and the first interlayer insulating layer.

Each of the first electrode and the second electrode may be disposed on and directly contact the light absorbing layer on the inner sidewall of the first region of the substrate.

A height of a top surface of the light emitting elements may be lower than a height of portions of the first electrode and the second electrode in the second region of the substrate measured from the substrate.

The display device may further comprise a second interlayer insulating layer disposed between the light absorbing layer and the first interlayer insulating layer, wherein the light absorbing layer may be disposed on and directly contact the second interlayer insulating layer.

The first electrode may be directly connected to a source electrode of the second conductive layer through a first contact hole penetrating the light absorbing layer and the second interlayer insulating layer, and the second electrode may be directly connected to a second voltage wire of the second conductive layer through a second contact hole penetrating the light absorbing layer and the second interlayer insulating layer.

The first contact hole and the second contact hole may be disposed in the second region of the substrate.

The light absorbing layer may be disposed on and directly contact the second conductive layer and the first interlayer insulating layer.

The first electrode may be directly connected to a source electrode of the second conductive layer through a first contact hole penetrating the light absorbing layer, and the second electrode may be directly connected to a second voltage wire of the second conductive layer through a second contact hole penetrating the light absorbing layer.

The display device may further comprise a second insulating layer disposed on the light emitting elements and exposing ends of the light emitting elements.

The display device may further comprise a first connection electrode disposed on the first electrode and electrically contacting the light emitting elements and the first electrode; and a second connection electrode disposed on the second electrode and electrically contacting the light emitting elements and the second electrode, wherein the first connection electrode and the second connection electrode may be disposed on the first region and the second region, respectively.

According to an embodiment, a display device may include a substrate including a first region and a second region surrounding the first region; a light absorbing layer disposed on the substrate and disposed in the first region and the second region; a first electrode and a second electrode extending in a first direction on the light absorbing layer, and including a portion intersecting the first region, and spaced apart from each other in a second direction in the first region; a first insulating layer disposed on the first electrode and the second electrode; and light emitting elements disposed on the first insulating layer in the first region, and having ends disposed on the first electrode and the second electrode.

The display device may further comprise a conductive layer disposed in the second region and overlapping the light absorbing layer.

The display device may further comprise an interlayer insulating layer disposed in the second region and overlapping the conductive layer, the interlayer insulating layer does not overlap the light emitting elements.

The display device may further comprise contact holes disposed in the second region and penetrating the light absorbing layer and the interlayer insulating layer, wherein each of the first electrode and the second electrode may be directly connected to the conductive layer through one of the contact holes.

The display device may further comprise a first connection electrode extending in the first direction and electrically contacting the first electrode and the light emitting elements; and a second connection electrode spaced apart from the first connection electrode in the second direction and electrically contacting the second electrode and the light emitting elements, wherein the first connection electrode and the second connection electrode may be disposed over the first region and the second region in the second direction of the first region, respectively.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
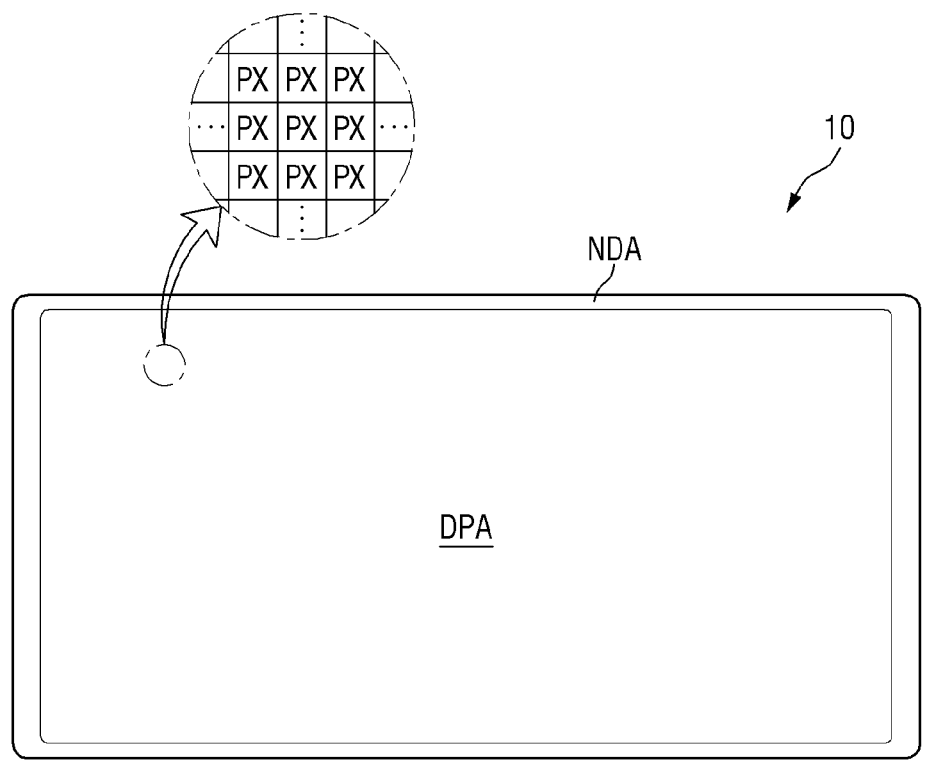
FIG. 1 is a schematic plan view of a display device according to an embodiment.
Figure 1:
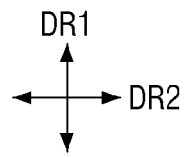

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to one embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 may include a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described, but the disclosure is not limited thereto, and other display panels may be applied within the scope of the disclosure.

The shape of the display device 10 may be variously modified. For example, the display device 10 may have a shape such as a substantially rectangular shape elongated in a horizontal direction, a substantially rectangular shape elongated in a vertical direction, a substantially square shape, a substantially quadrilateral shape with substantially rounded corners (vertices), another substantially polygonal shape and a substantially circular shape. The shape of a display area DPA of the display device 10 may also be similar to the overall shape of the display device 10. In FIG. 1, the display device 10 and the display area DPA having a substantially rectangular shape elongated in the horizontal direction are illustrated.

The display device 10 may include the display area DPA and a non-display area NDA. The display area DPA is an area where a screen can be displayed, and the non-display area NDA is an area where a screen is not displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged or disposed in a matrix. The shape of each pixel PX may be a substantially rectangular or substantially square shape in a plan view. However, the disclosure is not limited thereto, and it may be a substantially rhombic shape in which each side is inclined with respect to one direction or in a direction. The pixels PX may be alternately disposed in a stripe type or a PenTile® type. Each of the pixels PX may include one or more light emitting elements ED that emit light of a wavelength band to display a color.

The non-display area NDA may be disposed around the display area DPA. The non-display area NDA may completely or partially surround or may be adjacent to the display area DPA. The display area DPA may have a substantially rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
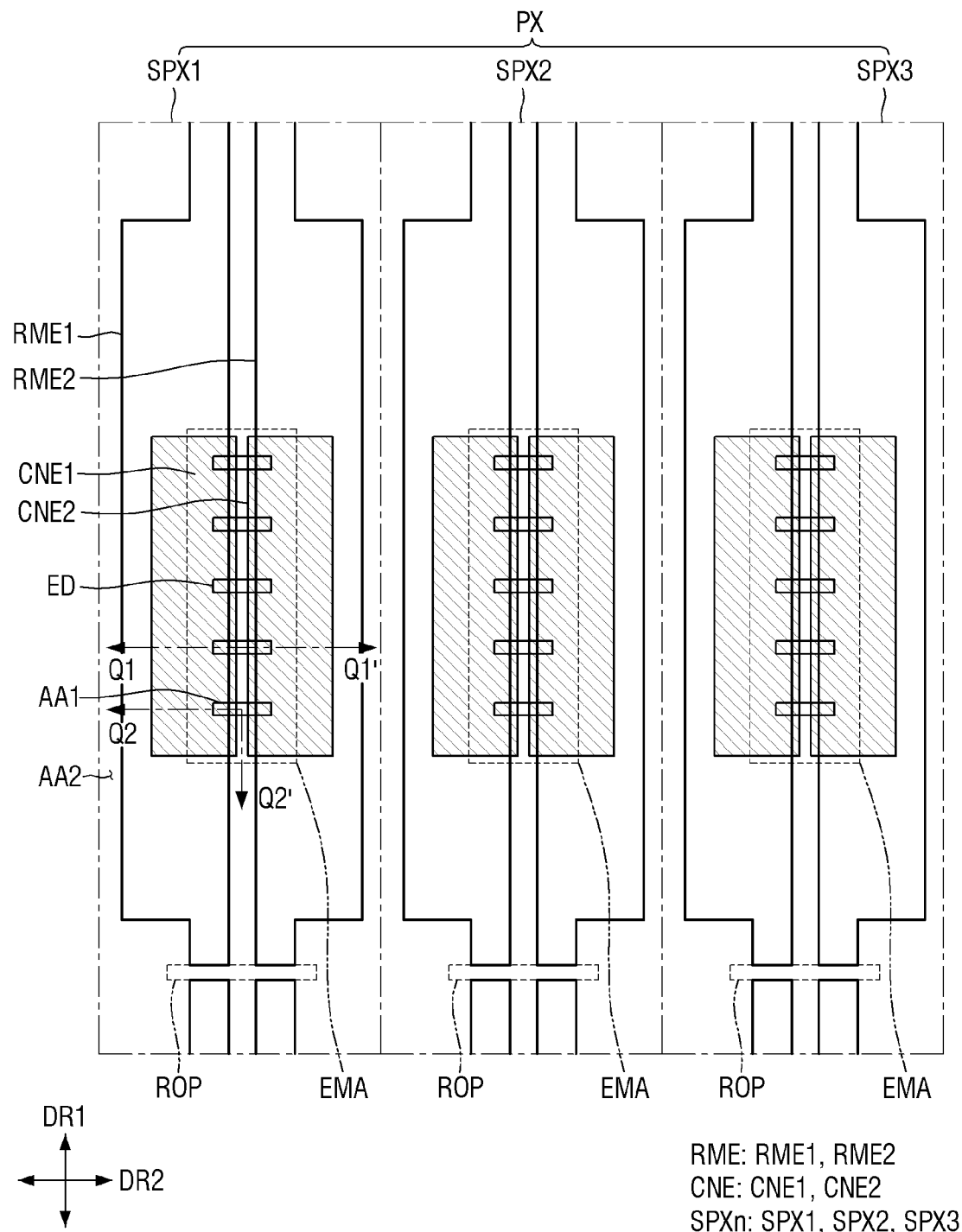
FIG. 2 is a schematic plan view illustrating one pixel of a display device according to an embodiment.

FIG. 2 is a schematic plan view illustrating one pixel of a display device according to an embodiment.

Referring to FIG. 2, each of the pixels PX may include sub-pixels SPXn (n being an integer of 1 to 3). For example, one pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn may emit light of the same color. For example, each sub-pixel SPXn may emit light of the first color, for example, blue light. Although FIG. 2 illustrates that the pixel PX may include three sub-pixels SPXn, the disclosure is not limited thereto, and the pixel PX may include a larger number of sub-pixels SPXn.

One pixel PX of the display device 10 may include first regions AA1, and each sub-pixel SPXn may include the first region AA1 and a second region AA2 surrounding the first region AA1. The first region AA1 may be an emission region where the light emitting element ED (see FIG. 6) is disposed to emit light of a wavelength band, and the second region AA2 may be a non-emission region where the light emitting element ED is not disposed and light emitted from the light emitting element ED does not reach and thus no light is emitted. The first region AA1 may include an area through which the light emitted from the light emitting element ED is emitted, which is an area adjacent to the light emitting element ED, in addition to the area where the light emitting element ED is disposed.

However, the "emission region" may also include an area where the light emitted from the light emitting element ED is reflected or refracted by other members and emitted, by including the first region AA1. The light emitting elements ED may be disposed in each sub-pixel SPXn, and the emission region may be formed to include an area where the light emitting elements ED are disposed and an area adjacent thereto.

The first regions AA1 of the sub-pixels SPXn may be arranged or disposed side by side in one direction or a direction. The first region AA1 may be located or disposed in the center portion of the sub-pixel SPXn, and the second region AA2 may be disposed to surround the first region AA1. As will be described later, the first region AA1 may be an area where circuit element layers of the display device 10 are not disposed, and may be defined as an area where the circuit element layers disposed in the second region AA2 and insulating layers are opened. For example, the first region AA1 of the display device 10 may be an area that is opened without circuit elements disposed therein, and an area other than the first region AA1 may be the second region AA2.

In each sub-pixel SPXn, electrodes RME extending in a first direction DR1 may be disposed and the light emitting elements ED may be disposed on the electrodes RME in the first region AA1. The electrodes RME may be disposed across the first region AA1 and the second region AA2, and a portion thereof disposed in the first region AA1 may not overlap the circuit element layers to be described later. The light emitting elements ED may be disposed on the electrodes RME in an area where the electrodes RME are not overlap the circuit element layers, and may be electrically connected to the electrodes RME to emit light. Hereinafter, the structure of the display device 10 will be described in detail with reference to other drawings.

Figure 3:
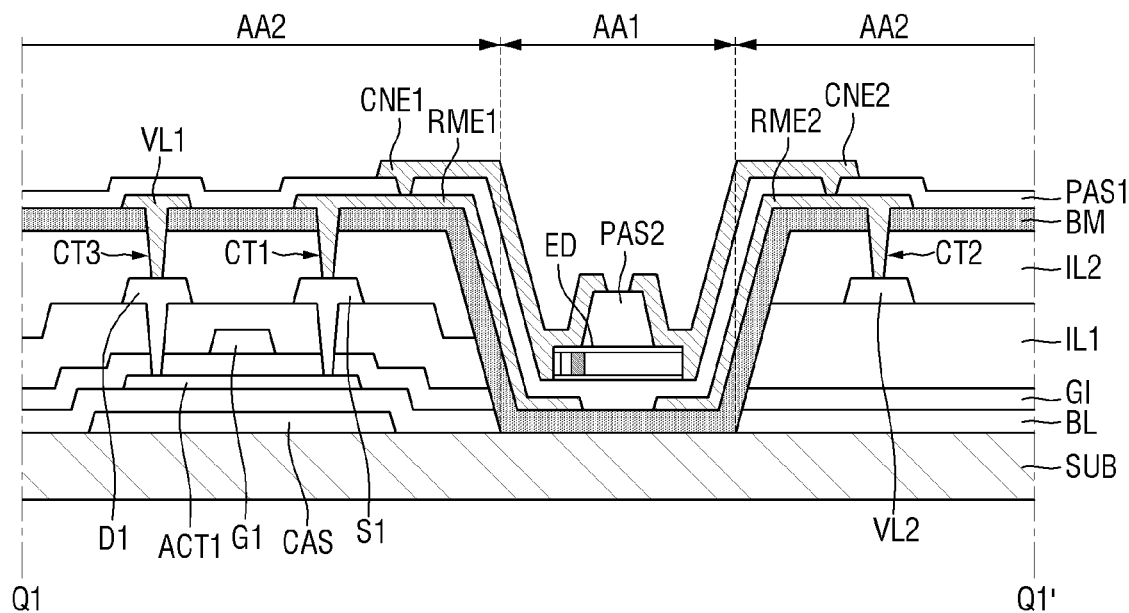
FIG. 3 is a schematic cross-sectional view taken along line Q1-Q1' of FIG. 2.
Figure 4:
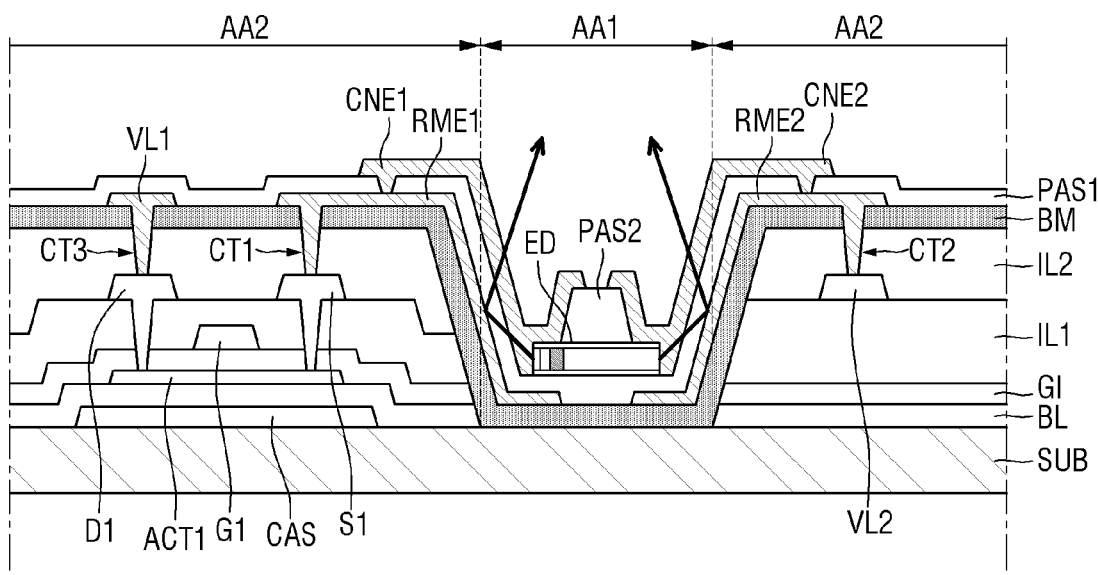
FIGS. 4 and 5 are schematic diagrams illustrating a traveling path of light emitted from a light emitting element of a display device according to an embodiment.
Figure 5:
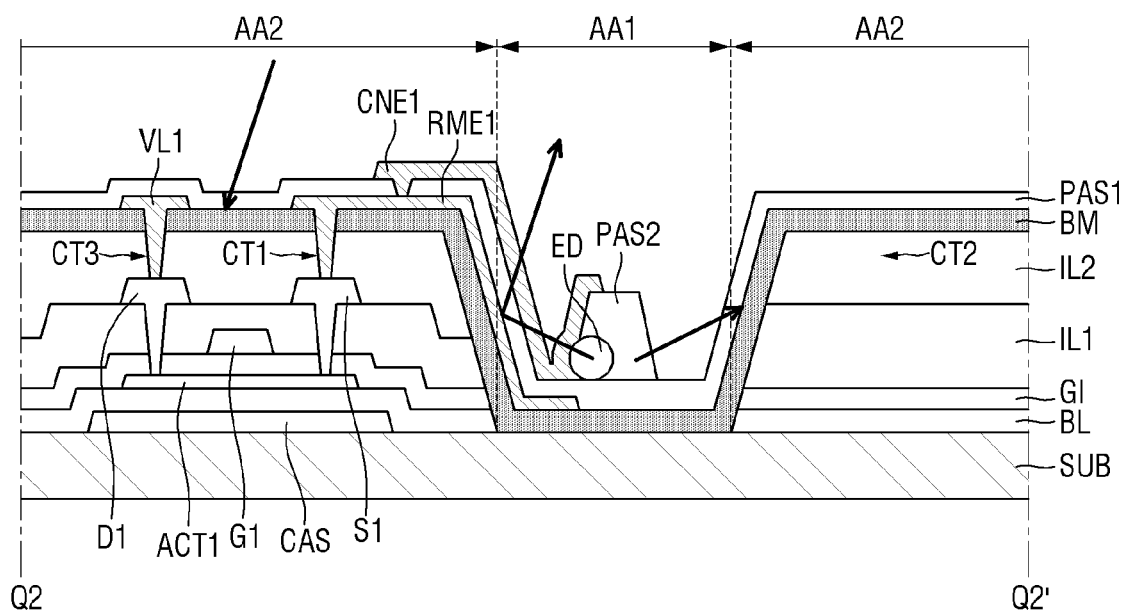

FIG. 3 is a schematic cross-sectional view taken along line Q1-Q1' of FIG. 2. FIGS. 4 and 5 are schematic diagrams illustrating a traveling path of light emitted from a light emitting element of a display device according to an embodiment. FIGS. 3 and 4 illustrate schematic cross sections penetrating both ends of the light emitting element ED disposed in the first sub-pixel SPX1, which are cross sections traversing the first region AA1 in a second direction DR2. FIG. 5 illustrate a schematic cross section that traverses the first region AA1 in the second direction DR2 from one end or an end of the light emitting element disposed in the first sub-pixel SPX1. FIG. 4 shows that the light emitted from the light emitting element ED of FIG. 3 is reflected from the electrodes RME1 and RME2 and emitted. FIG. 5 shows that the travel of internal light emitted from the light emitting element ED and external light incident from the outside.

Referring to FIGS. 3 to 5 in connection with FIG. 2, the display device 10 may include a first substrate or a substrate SUB, conductive layers disposed on the first substrate SUB, the light emitting element ED, and insulating layers. Some or a part of the conductive layers may be the circuit element layers disposed in the second region AA2 to drive the light emitting element ED, and some others may be the electrode RME and a connection electrode CNE, or the like, disposed in the first region AA1 and electrically connected to the light emitting element ED.

The first substrate SUB may be an insulating substrate of a transparent material. The first substrate SUB may be made of an insulating material such as glass, quartz, or polymer resin. Further, the first substrate SUB may be a rigid substrate, but may also be a flexible substrate which can be bent, folded or rolled. The first substrate SUB may include the first region AA1 where the light emitting elements ED, which will be described later, are disposed, and as a region other than the first region AA1, the second region AA2 where the circuit element layer is disposed.

A lower metal layer CAS is disposed on the first substrate SUB. The lower metal layer CAS is disposed to overlap a first active layer ACT1 of a first transistor T1 to be described later. The lower metal layer CAS may include a material of blocking light to prevent light from reaching the first active layer ACT1 of the first transistor T1. For example, the lower metal layer CAS may be made of an opaque metal material that blocks transmission of light. The lower metal layer CAS may be provided only in the second region AA2 where the circuit elements are disposed, without being provided in the first region AA1 where the light emitting element ED is disposed, and may be disposed to one side or a side of the first region AA1 in the second direction DR2. However, the disclosure is not limited thereto, and in some cases, the lower metal layer CAS may be omitted.

A buffer layer BL may be disposed on the first substrate SUB to cover or overlap the lower metal layer CAS. The buffer layer BL may be disposed in the second region AA2 except for the first region AA1, and may open the first region AA1. The buffer layer BL may be formed on the first substrate SUB to protect the first transistor T1 from moisture permeating through the first substrate SUB susceptible to moisture permeation, and may perform a surface planarization function.

The semiconductor layer is disposed on the buffer layer BL. The semiconductor layer may include the first active layer ACT1 of the first transistor T1. The first active layer ACT1 may be disposed to overlap the lower metal layer CAS in a third direction DR3, which is a thickness direction, in the second region AA2. The first active layer ACT1 may be formed to have a width smaller than that of the lower metal layer CAS, and may be entirely overlap the lower metal layer CAS.

The semiconductor layer may include polycrystalline silicon, monocrystalline silicon, oxide semiconductor, and the like within the spirit and the scope of the disclosure. In an embodiment, the semiconductor layer may include polycrystalline silicon. In case that the semiconductor layer may include an oxide semiconductor, the first active layer ACT1 may be an oxide semiconductor containing indium (In). In an embodiment, the oxide semiconductor may be indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) or the like within the spirit and the scope of the disclosure.

The first gate insulating layer GI is disposed on the semiconductor layer and the buffer layer BL. For example, the first gate insulating layer GI may be disposed to cover or overlap the top surfaces of the semiconductor layer and the buffer layer BL. The first gate insulating layer GI may function as a gate insulating layer of each transistor. The first gate insulating layer GI may be disposed in the second region AA2 except for the first region AA1, and may open the first region AA1.

The first conductive layer is disposed on the first gate insulating layer GI. The first conductive layer may include a first gate electrode G1 of the first transistor T1, and the first gate electrode G1 may be disposed to overlap the first active layer ACT1 in the third direction DR3. For example, the first conductive layer may be disposed only in the second region AA2 without being disposed in the first region AA1.

A first interlayer insulating layer IL1 may be disposed on the first conductive layer. The first interlayer insulating layer IL1 may be arranged or disposed to cover or overlap the first conductive layer to protect the first conductive layer. The first interlayer insulating layer IL1 may also be disposed in the second region AA2 except for the first region AA1, and may open the first region AA1.

A second conductive layer is disposed on the first interlayer insulating layer IL1. The second conductive layer may include a first source electrode S1 and a first drain electrode D1 of the first transistor T1 and a second voltage wire VL2.

The first source electrode S1 and the first drain electrode D1 may be disposed in the second region AA2 located or disposed on one side or a side of the first region AA1 in the second direction DR2, and may be in electrical contact with the first active layer ACT1 through a contact hole penetrating the first gate insulating layer GI and the first interlayer insulating layer IL1 disposed therebelow. Further, although not shown in the drawings, the first source electrode S1 may also be in electrical contact with the lower metal layer CAS through a contact hole penetrating the buffer layer BL, the first gate insulating layer GI, and the first interlayer insulating layer IL1. The first drain electrode D1 may be electrically connected to a first voltage wire VL1 of a third conductive layer to be described later, and the first source electrode S1 may be electrically connected to a first electrode RME1. The first transistor T1 may transfer a power voltage applied to the first voltage wire VL1 to the first electrode RME1 in response to a turn-on signal.

The second voltage wire VL2 may be disposed in the second region AA2 located or disposed on the other side or another side of the first region AA1 in the second direction DR2, and may be electrically connected to a second electrode RME2 of the third conductive layer to be described later. The second voltage wire VL2 may be applied with a low potential voltage (or a second power voltage) transmitted to the second electrode RME2.

A second interlayer insulating layer IL2 may be disposed on the second conductive layer. The second interlayer insulating layer IL2 may be arranged or disposed to cover or overlap the second conductive layer to protect the first conductive layer. The second interlayer insulating layer IL2 may also be disposed in the second region AA2 except for the first region AA1, and may open the first region AA1.

The first and second conductive layers may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the disclosure is not limited thereto.

The buffer layer BL, the first gate insulating layer GI, the first interlayer insulating layer IL1, and the second interlayer insulating layer IL2 may be formed of a single layer or inorganic layers in which layers may be stacked each other or the layers may be alternately stacked each other. For example, the buffer layer BL, the first gate insulating layer GI, the first interlayer insulating layer IL1 and the second interlayer insulating layer IL2 may be formed of an inorganic layer including at least one of silicon oxide ($SiO_x$), silicon nitride ($SiN_x$), or silicon oxynitride ($SiO_xN_y$), or may be formed of a multilayer in which such inorganic layers may be alternately stacked each other, or a double layer in which silicon oxide ($SiO_x$) and silicon nitride ($SiN_x$) may be sequentially stacked each other.

The buffer layer BL, the first gate insulating layer GI, the first interlayer insulating layer IL1, and the second interlayer insulating layer IL2 may be entirely disposed in the second region AA2 except for the first region AA1 on the first substrate SUB. The buffer layer BL, the first gate insulating layer GI, the first interlayer insulating layer IL1, and the second interlayer insulating layer IL2 may be disposed over the entire display area DPA to open the first regions AA1, and may form a bank structure surrounding the first region AA1 together with the conductive layers. The circuit element layers of the first and second conductive layers may be disposed in the second region AA2 to form a part of the bank structure. The second region AA2 where the bank structure is disposed may have a height higher than that of the first region AA1, and the light emitting elements ED arranged or disposed in the first region AA1 may be disposed only in the first region AA1 having a relatively low height in the display area DPA.

As the bank structure is formed to have a given height, the light emitting elements ED arranged or disposed in each sub-pixel SPXn may be disposed in each sub-pixel SPXn without being mixed with the light emitting elements ED of other adjacent sub-pixels SPXn. The inner sidewall of the first region AA1 opened by the bank structures may be formed to be inclined, and a layer for improving the light emission efficiency of the light emitted from the light emitting element ED may be disposed on the inclined sidewall.

In the display device 10, internal light generated by the light emitting element ED may be emitted, and external light may be incident from the outside to the display area DPA. The external light may be incident on the entire surface of the display area DPA and reflected from the first and second conductive layers. As the light emitting elements ED are disposed in the first region AA1 having a low height, a part of the internal light emitted from the light emitting elements ED may also be reflected from the first and second conductive layers. The internal light and external light reflected in the display device 10 may be an obstacle for the user to visually recognize the screen of the display area DPA. The display device 10 according to an embodiment may include a light absorbing layer BM that absorbs light reflected from the first and second conductive layers in order to prevent the reflection of the internal light emitted from the light emitting element ED and the external light incident from the outside.

The light absorbing layer BM is disposed across the first region AA1 and the second region AA2. The light absorbing layer BM may be disposed over the entire surface of the display area DPA, and may be disposed on or directly disposed on the first substrate SUB in the first region AA1, and disposed on the second interlayer insulating layer IL2 in the second region AA2. The light absorbing layer BM may also be disposed on the inner sidewall of the first region AA1 opened by the buffer layer BL, the first gate insulating layer GI, the first interlayer insulating layer IL1, and the second interlayer insulating layer IL2. For example, the light absorbing layer BM may be disposed to cover or overlap the top surface of the bank structure formed by the buffer layer BL, the first gate insulating layer GI, the first interlayer insulating layer IL1, and the second interlayer insulating layer IL2, and the inner sidewall of the first region AA1 opened by the bank structure. Accordingly, the light absorbing layer BM may be in contact with or direct contact with the side surfaces of the buffer layer BL, the first gate insulating layer GI, and the first interlayer insulating layer IL1. The light absorbing layer BM may be disposed to overlap the first and second conductive layers in the thickness direction, and may also overlap the light emitting element ED, which will be described later, in the thickness direction.

A part of the light absorbing layer BM may be disposed above the first and second conductive layers, while another part thereof may be disposed below and to the side of the light emitting element ED. Since a part of the light absorbing layer BM provided in the second region AA2 is disposed on the bank structures, it may be disposed above the first and second conductive layers, and since another part of the light absorbing layer BM is disposed in the first region AA1 and the inner sidewall of the first region AA1 opened by the bank structures, it may be disposed below and to the side of the light emitting element ED.

Since the light absorbing layer BM is entirely disposed in the first region AA1 and the second region AA2, the external and internal light may be prevented from being directed toward the first and second conductive layers. In an embodiment, the light absorbing layer BM may include a light absorbing material capable of absorbing all visible wavelengths. For example, the light absorbing layer BM may be formed of an organic light blocking material which is a material used as a black matrix.

The third conductive layer may be disposed on the light absorbing layer BM. The third conductive layer may include the first voltage wire VL1, the first electrode RME1, and the second electrode RME2.

The first voltage wire VL1 may be disposed in the second region AA2 located or disposed on one side or a side of the first region AA1 in the second direction DR2, and may be electrically connected to the first drain electrode D1 of the second conductive layer. As an example, the first voltage wire VL1 may be in electrical contact with the first drain electrode D1 through a third contact hole CT3 penetrating the light absorbing layer BM and the second interlayer insulating layer IL2. A high potential voltage (or a first power voltage) transmitted to the first electrode RME1 may be applied to the first voltage wire VL1, and the high potential voltage may be transmitted to the first electrode RME1 through the first transistor T1. However, the first voltage wire VL1 may not necessarily be formed as the third conductive layer, and in an embodiment, the first voltage wire VL1 may be formed as the second conductive layer.

The electrodes RME (RME1 and RME2) may be disposed on or directly disposed on the light absorbing layer BM, may extend in the first direction DR1, and may be spaced apart from each other in the second direction DR2. The electrodes RME may include the first electrode RME1 and the second electrode RME2, and the first electrode RME1 and the second electrode RME2 form a pair and are disposed for each sub-pixel SPXn. The first electrode RME1 and the second electrode RME2 may be disposed across the first region AA1 and the second region AA2 while crossing or intersecting the first region AA1 in the first direction DR1. The first electrode RME1 and the second electrode RME2 are spaced apart from each other in the second direction DR2 around the center of the first region AA1. Parts of the first and second electrodes RME1 and RME2 disposed in the first region AA1 may be positioned, with respect to the first substrate SUB, at a lower height than parts thereof disposed in the second region AA2. The first electrode RME1 and the second electrode RME2 may also be disposed on the inner sidewall of the first region AA1 in the first direction DR1 and the second direction DR2.

On the other hand, the electrode RME may be separated from the electrode RME of another sub-pixel SPXn adjacent in the first direction DR1 by a separation portion ROP disposed to the other side, for example, the lower side, of the first region AA1 in the first direction DR1. The first electrode RME1 of each sub-pixel SPXn may receive the first power voltage through the first transistor T1 disposed in the corresponding sub-pixel SPXn, and since it is separated from the first electrode RME1 of another sub-pixel SPXn by the separation portion ROP, each sub-pixel SPXn may emit light individually.

The first electrode RME1 and the second electrode RME2 may be electrically connected to a part of the second conductive layer in the second region AA2. For example, the first electrode RME1 may be electrically connected or directly connected to the first source electrode S1 through a first contact hole CT1 penetrating the light absorbing layer BM and the second interlayer insulating layer IL2 in the second region AA2, and the second electrode RME2 may be electrically connected or directly connected to the second voltage wire VL2 through a second contact hole CT2 penetrating the light absorbing layer BM and the second interlayer insulating layer IL2 in the second region AA2.

In the drawings, it is illustrated that one first electrode RME1 and one second electrode RME2 are arranged or disposed in each sub-pixel SPXn, but the disclosure is not limited thereto, and the arrangement position of the electrodes RME1 and RME2 disposed in each sub-pixel SPXn may vary depending on the number of the electrodes or the number of the light emitting elements ED arranged or disposed in each sub-pixel SPXn.

The electrodes RME1 and RME2 may be electrically connected to the light emitting element ED. The electrodes RME1 and RME2 may be electrically connected to both ends of the light emitting element ED through connection electrodes CNE1 and CNE2 to be described later, respectively, and may transmit, to the light emitting element ED, electrical signals applied from the voltage wires VL1 and VL2 disposed in the second region AA2.

The third conductive layer may include a conductive material having high reflectivity. Each of the electrodes RME1 and RME2 may include a metal such as silver (Ag), copper (Cu), or aluminum (Al) as a material having high reflectivity, or may be an alloy including aluminum (Al), nickel (Ni), lanthanum (La), and the like within the spirit and the scope of the disclosure. However, the disclosure is not limited thereto, and each of the electrodes RME1 and RME2 may further include a transparent conductive material. For example, each of the electrodes RME1 and RME2 may include a material such as ITO, IZO, and ITZO. In an embodiment, each of the electrodes RME1 and RME2 may have a structure in which at least one transparent conductive material and at least one metal layer having high reflectivity may be stacked each other, or may be formed as one layer or a layer including them. For example, each of the electrodes RME1 and RME2 may have a stacked structure of ITO/Ag/ITO, ITO/Ag/IZO, ITO/Ag/ITZO/IZO, or the like within the spirit and the scope of the disclosure. Since the electrodes RME contain a material having high reflectivity, the light emitted from the light emitting element ED may be reflected from parts of the electrodes RME disposed in the first region AA1 and emitted upward.

A first insulating layer PAS1 is disposed across the first region AA1 and the second region AA2 on the third conductive layer. The first insulating layer PAS1 may be disposed over the entire surface of the display area DPA to cover or overlap the third conductive layer. The first insulating layer PAS1 may cover or overlap the first electrode RME1 and the second electrode RME2 to insulate them from each other, and may prevent the light emitting element ED disposed thereon from being damaged by contact with or direct contact with other members.

The first insulating layer PAS1 may include contact portions that expose a part of the top surface of each electrode RME. The contact portions may penetrate the first insulating layer PAS1, and the connection electrodes CNE to be described later may be in electrical contact with the electrodes RME exposed through the contact portions.

The light emitting elements ED are disposed on the first insulating layer PAS1 in the first region AA1. The light emitting elements ED may be disposed to be spaced apart from each other along the first direction DR1 in which the electrodes RME1 and RME2 extend, and may be aligned substantially parallel to each other. The light emitting element ED may have a shape extending in one direction or in a direction, and the extension direction of the light emitting element ED may be substantially perpendicular to the extension direction of the electrodes RME1 and RME2. However, the disclosure is not limited thereto, and the light emitting elements ED may each be arranged or disposed to extend in a direction oblique to the extension direction of the electrodes RME1 and RME2.

The light emitting element ED may include layers arranged or disposed in a direction parallel to the top surface of the first substrate SUB. The light emitting element ED of the display device 10 may be disposed such that one extension direction thereof is parallel to the first substrate SUB, and the semiconductor layers included in the light emitting element ED may be sequentially arranged or disposed in a direction parallel to the top surface of the first substrate SUB. However, the disclosure is not limited thereto. In some cases, in case that the light emitting element ED has a different structure, the layers may be arranged or disposed in a direction perpendicular to the first substrate SUB.

The light emitting element ED may be disposed above the electrodes RME1 and RME2 spaced apart in the second direction DR2. The extension length of the light emitting element ED may be greater than the gap between the electrodes RME1 and RME2 spaced apart in the second direction DR2, and the both ends of the light emitting element ED may be disposed on different electrodes. The light emitting element ED may be disposed such that the first end is placed above the first electrode RME1 and the second end is placed above the second electrode RME2. However, the disclosure is not limited thereto, and at least some or part of the light emitting elements ED may each be disposed such that the first end is placed above the second electrode RME2 and the second end is placed above the first electrode RME1.

As an example, at least some or part of the light emitting elements ED may each be disposed such that only one end or an end thereof is placed above the electrode RME1, RME2.

The light emitting elements ED may be in electrical contact with the connection electrodes CNE (CNE1 and CNE2) to be electrically connected to the electrodes RME. Since a part of the semiconductor layer is exposed at the end surface of the light emitting element ED extending in one direction or a direction, the exposed semiconductor layer may be in electrical contact with the connection electrode CNE. The light emitting elements ED may be electrically connected to the electrode RME or the conductive layers through the connection electrodes CNE, and may be applied with an electrical signal to emit light of a wavelength band.

The second insulating layer PAS2 may be disposed on the light emitting elements ED. In one example, the second insulating layer PAS2 is disposed to partially surround the outer surface of the light emitting element ED without covering or overlapping both sides or both ends of the light emitting element ED. The portion of the second insulating layer PAS2 disposed on the light emitting element ED may be arranged or disposed to extend in the first direction DR1 on the first insulating layer PAS1 in a plan view, so that it may form a substantially linear or island-like pattern in each sub-pixel SPXn. The second insulating layer PAS2 may protect the light emitting element ED while fixing the light emitting element ED during the fabricating process of the display device 10. Further, the second insulating layer PAS2 may be disposed to fill the space between the light emitting element ED and the first insulating layer PAS1 thereunder.

The connection electrodes CNE1 and CNE2 may be disposed on the second insulating layer PAS2. The connection electrode CNE1, CNE2 may be in electrical contact with one end or an end of the light emitting element ED and at least one of the electrodes RME1 and RME2.

The connection electrodes CNE may have a shape extending in the first direction DR1 and may be disposed to be spaced apart from each other in the second direction DR2. The connection electrodes CNE may be spaced apart from each other in the second direction DR2 on the second insulating layer PAS2 in the first region AA1 and may be disposed across the first region AA1 and the second region AA2. In an embodiment, the length of each connection electrode CNE extending in the first direction DR1 may be smaller than the length of the first region AA1 in the first direction DR1, but the width thereof measured in the second direction DR2 may be greater than half of the width of the first region AA1 measured in the second direction DR2. Accordingly, the connection electrodes CNE may each be disposed across the first region AA1 and the second region AA2, and may be disposed on the inner sidewall of the first region AA1 on both sides in the second direction DR2. Each of the connection electrodes CNE may form an island-shaped pattern in each sub-pixel SPXn.

The first connection electrode CNE1 may be disposed on the first electrode RME1 to be in electrical contact with the light emitting element ED and the first electrode RME1, and the second connection electrode CNE2 may be disposed on the second electrode RME2 to be in electrical contact with the light emitting element ED and the second electrode RME2. The first connection electrode CNE1 may be in electrical contact with the first electrode RME1 through the contact portion formed in a portion overlapping the first electrode RME1 in the second region AA2, and the second connection electrode CNE2 may be in electrical contact with the second electrode RME2 through the contact portion formed in a portion overlapping the second electrode RME2 in the second region AA2.

In the drawings, it is illustrated that one first connection electrode CNE1 and one second connection electrode CNE2 are arranged or disposed in one sub-pixel SPXn, but the disclosure is not limited thereto. The number and shape of the connection electrodes CNE1 and CNE2 may vary depending on the number of the electrodes RME1 and RME2 disposed in each sub-pixel SPXn.

The connection electrodes CNE1 and CNE2 may include a conductive material. For example, they may include ITO, IZO, ITZO, aluminum (Al), or the like within the spirit and the scope of the disclosure. As an example, the connection electrodes CNE1 and CNE2 may include a transparent conductive material, and the light emitted from the light emitting element ED may penetrate the connection electrodes CNE1 and CNE2.

Although not shown in the drawings, an insulating layer may be further disposed on the connection electrodes CNE1 and CNE2 and the second insulating layer PAS2 to cover or overlap them. The insulating layer may be disposed all over the first substrate SUB to protect the members disposed on the first substrate SUB from the external environment.

Each of the first insulating layer PAS1 and the second insulating layer PAS2 described above may include an inorganic insulating material or an organic insulating material. However, the disclosure is not limited thereto.

The display device 10 may include the first region where the light emitting elements ED are disposed, and the second region AA2, which is an area surrounding the first region AA1, where layers constituting the bank structure, and the first and second conductive layers constituting the circuit element layer are disposed. In light emission of the pixel PX in the display device 10, the light emitting element ED that emits light and the circuit element layers that drive the light emitting element ED may be divided and disposed into different regions. The display device 10 may include the light absorbing layer BM disposed in the first region AA1 and the second region AA2 to prevent the external and internal light from being reflected by the circuit element layer.

As shown in FIG. 4, the light absorbing layer BM is disposed in both the first region AA1 and the second region AA2, and is disposed above the first and second conductive layers, and below the light emitting elements ED. The light emitted from the light emitting elements ED may be reflected by the electrodes RME disposed on the inner sidewalls of the bank structures to be emitted in the upward direction of the first substrate SUB. Among the internal light emitted from the light emitting element ED, light directed toward the electrode RME may be reflected from the electrode RME and smoothly emitted.

While, as shown in FIG. 5, among the internal light emitted from the light emitting element ED, light directed toward a region where the electrode RME is not disposed, for example, a portion where the electrodes RME are spaced apart on both sides of the first region AA1 in the first direction DR1 may be directed toward the light absorbing layer BM disposed on the inner sidewall of the first region AA1. The light absorbing layer BM may be made of a material that absorbs light in the visible wavelength band, and may absorb light that is not directed to the electrode RME among the internal light emitted from the light emitting element ED. Accordingly, the internal light may be prevented from being reflected from the first and second conductive layers and being emitted to the outside. Similarly, since the external light incident from the outside of the display device 10 is also incident on the light absorbing layer BM covering or overlapping the second region AA2 to be absorbed thereinto, it may not be reflected from the first and second conductive layers. The display device 10 according to an embodiment may include the light absorbing layer BM capable of allowing a part of light emitted from the light emitting element ED to be smoothly emitted upward while preventing the other part thereof and the external light from being reflected from the conductive layers. Accordingly, the display device 10 may improve the visibility by preventing the reflection of the internal light and the external light.

Figure 6:
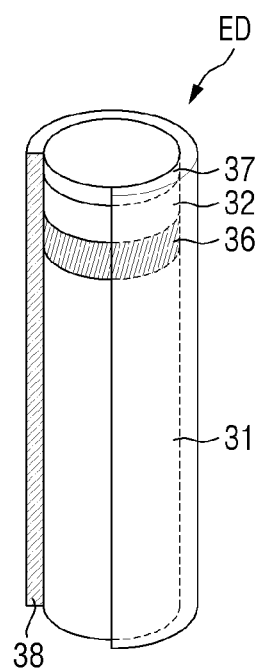
FIG. 6 is a schematic view of a light emitting element according to an embodiment.

FIG. 6 is a schematic view of a light emitting element according to an embodiment.

The light emitting element ED may be a light emitting diode. For example, the light emitting element ED may be an inorganic light emitting diode that has a micrometer or nanometer size, and is made of an inorganic material. The inorganic light emitting diode may be aligned between two electrodes having polarity in case that an electric field is formed in a direction between two electrodes opposing each other. Each light emitting element ED may be aligned between two electrodes by the electric field generated between the electrodes.

The light emitting element ED according to an embodiment may have a shape elongated in one direction or in a direction. The light emitting element ED may have a shape of substantially of a cylinder, a rod, a wire, a tube, or the like within the spirit and the scope of the disclosure. However, the shape of the light emitting element ED is not limited thereto, and the light emitting element ED may have a substantially polygonal prism shape such as a substantially regular cube, a substantially rectangular parallelepiped and a substantially hexagonal prism, or may have various shapes such as a shape elongated in one direction or in a direction and having an outer surface partially inclined. Semiconductors included in the light emitting element ED to be described later may have a structure in which they may be sequentially disposed or stacked each other along the one direction or a direction.

The light emitting element ED may include a semiconductor layer doped with any conductivity type (for example, p-type or n-type) impurities. The semiconductor layer may emit light of a wavelength band by receiving an electrical signal applied from an external power source.

Referring to FIG. 6, the light emitting element ED may include a first semiconductor layer 31, a second semiconductor layer 32, a light emitting layer 36, an electrode layer 37, and an insulating layer 38.

The first semiconductor layer 31 may be an n-type semiconductor. In case that the light emitting element ED emits light of a blue wavelength band, the first semiconductor layer 31 may include a semiconductor material having a chemical formula of $Al_xGa_yIn1-x-yN$ ($0 \leq x \leq 1$, $0 \leq y \leq 1$, $0 \leq x+y \leq 1$). For example, it may be any one or more of n-type doped AlGaInN, GaN, AlGaN, InGaN, AlN and InN. The first semiconductor layer 31 may be doped with an n-type dopant, and the n-type dopant may be Si, Ge, Sn, or the like within the spirit and the scope of the disclosure. For example, the first semiconductor layer 31 may be n-GaN doped with n-type Si. The length of the first semiconductor layer 31 may have a range of about 1.5 μm to about 5 μm, but is not limited thereto. The first end of the light emitting element ED may be a part in which the first semiconductor layer 31 is disposed in relation to the light emitting layer 36.

The second semiconductor layer 32 is disposed on the light emitting layer 36 to be described later. The second semiconductor layer 32 may be a p-type semiconductor. In case that the light emitting element ED emits light of a blue or green wavelength band, the second semiconductor layer 32 may include a semiconductor material having a chemical formula of $Al_xGa_yIn1-x-yN$ ($0 \le x \le 1$, $0 \le y \le 1$, $0 \le x+y \le 1$). For example, it may be any one or more of p-type doped AlGaInN, GaN, AlGaN, InGaN, AlN and InN. The second semiconductor layer 32 may be doped with a p-type dopant, and the p-type dopant may be Mg, Zn, Ca, Se, Ba, or the like within the spirit and the scope of the disclosure. For example, the second semiconductor layer 32 may be p-GaN doped with p-type Mg. The length of the second semiconductor layer 32 may have a range of about 0.05 μm to about 0.10 μm, but is not limited thereto. The second end of the light emitting element ED may be a part in which the second semiconductor layer 32 is disposed in relation to the light emitting layer 36.

Although it is illustrated in the drawing that the first semiconductor layer 31 and the second semiconductor layer 32 may be formed as one layer or a layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 is disposed between the first semiconductor layer 31 and the second semiconductor layer 32. The light emitting layer 36 may include a material having a single or multiple quantum well structure. In case that the light emitting layer 36 may include a material having a multiple quantum well structure, quantum layers and well layers may be alternately stacked each other. The light emitting layer 36 may emit light by coupling of electron-hole pairs according to an electrical signal applied through the first semiconductor layer 31 and the second semiconductor layer 32. In case that the light emitting layer 36 emits light of a blue wavelength band, a material such as AlGaN or AlGaInN may be included. In case that the light emitting layer 36 has a structure in which quantum layers and well layers may be alternately stacked each other in a multiple quantum well structure, the quantum layer may include a material such as AlGaN or AlGaInN, and the well layer may include a material such as GaN or AlInN. For example, as described above, the light emitting layer 36 may include AlGaInN as a quantum layer and AlInN as a well layer, and the light emitting layer 36 may emit blue light having a central wavelength band in a range of about 450 nm to about 495 nm.

However, the disclosure is not limited thereto, and the light emitting layer 36 may have a structure in which semiconductor materials having large band gap energy and semiconductor materials having small band gap energy may be alternately stacked each other, and may include other group III to V semiconductor materials according to the wavelength band of the emitted light. The light emitted by the light emitting layer 36 is not limited to light of a blue wavelength band, but the light emitting layer 36 may also emit light of a red or green wavelength band in some cases. The length of the light emitting layer 36 may have a range of about 0.05 μm to about 0.10 μm, but is not limited thereto.

Light emitted from the light emitting layer 36 may be emitted to both side surfaces as well as the outer surface of the light emitting element ED in the longitudinal direction. The directionality of light emitted from the light emitting layer 36 is not limited to one direction or a direction.

The electrode layer 37 may be an ohmic connection electrode. However, the disclosure is not limited thereto, and it may be a Schottky connection electrode. The light emitting element ED may include at least one electrode layer 37. Although FIG. 6 illustrates that the light emitting element ED may include one electrode layer 37, the disclosure is not limited thereto. In some cases, the light emitting element ED may include a larger number of electrode layers 37 or may be omitted. The following description of the light emitting element ED may be equally applied even if the number of electrode layers 37 is different or further may include other structures.

In the display device 10 according to an embodiment, in case that the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO. Further, the electrode layer 37 may include an n-type or p-type doped semiconductor material. However, the disclosure is not limited thereto.

The insulating layer 38 is arranged or disposed to surround the outer surfaces of the semiconductor layers and electrode layers described above. For example, the insulating layer 38 may be arranged or disposed to surround the outer surface of at least the light emitting layer 36, and the light emitting element ED may be elongated in one direction or in a direction. The insulating layer 38 may function to protect the members. The insulating layer 38 may be formed to surround side surfaces of the members to expose both ends of the light emitting element ED in the longitudinal direction.

Although it is illustrated in the drawing that the insulating layer 38 extends in the longitudinal direction of the light emitting element ED to cover or overlap a region from the first semiconductor layer 31 to the side surface of the electrode layer 37, the disclosure is not limited thereto. The insulating layer 38 may include the light emitting layer 36 to cover or overlap only the outer surfaces of some semiconductor layers, or may cover or overlap only a portion of the outer surface of the electrode layer 37 to partially expose the outer surface of each electrode layer 37. Further, in schematic cross-sectional view, the insulating layer 38 may have a substantially top surface, which may be rounded in a region adjacent to at least one end or an end of the light emitting element ED.

The thickness of the insulating layer 38 may have a range of about 10 nm to about 1.0 μm, but is not limited thereto. By way of example, the thickness of the insulating layer 38 may be about 40 nm.

The insulating layer 38 may include a material having insulating properties, such as silicon oxide ($SiO_x$), silicon nitride ($SiN_x$), silicon oxynitride ($SiO_xN_y$), aluminum nitride ($AlN_x$), and aluminum oxide $AlO_x$). Although it is shown in the drawing that the insulating layer 38 is formed as a single layer, the disclosure is not limited thereto. In an embodiment, the insulating layer 38 may be formed in a multilayer structure in which layers may be stacked each other. Accordingly, it is possible to prevent an electrical short circuit that may occur in case that the light emitting layer 36 is in electrical contact or direct contact with the electrode through which the electrical signal is transmitted to the light emitting element ED. Since the insulating layer 38 may include the light emitting layer 36 to protect the outer surface of the light emitting element ED, it is possible to prevent degradation in light emission efficiency.

Further, the insulating layer 38 may have an outer surface which is surface-treated. The light emitting elements ED may be aligned in such a way of spraying the ink in which the light emitting elements ED are dispersed on the electrodes. Here, the surface of the insulating layer 38 may be treated in a hydrophobic or hydrophilic manner in order to keep the light emitting elements ED in a dispersed state without aggregation with other light emitting elements ED adjacent in the ink. For example, the insulating layer 38 may be surface-treated on the outer surface thereof with a material such as stearic acid and 2,3-naphthalene dicarboxylic acid.

The light emitting element ED may have a length in a range of about 1 µm to about 10 µm or in a range of about 2 µm to about 6 µm, and for example, in a range of about 3 µm to about 5 µm. Further, a diameter of the light emitting element ED may have a range of about 30 nm to about 700 nm, and an aspect ratio of the light emitting element ED may be in a range of about 1.2 to about 100. However, the disclosure is not limited thereto, and the light emitting elements ED included in the display device 10 may have different diameters according to a difference in composition of the light emitting layer 36. The diameter of the light emitting element ED may have a range of about 500 nm.

Hereinafter, a fabricating process of the display device 10 according to an embodiment will be described with reference to other drawings.

FIGS. 7 to 17 are schematic cross-sectional views sequentially illustrating a fabricating process of a display device according to an embodiment. In the fabricating process of the display device 10 described with reference to FIGS. 7 to 17, the order and method of forming the layers will be described in detail, and the structure and arrangement of the layers will be omitted in the description since they are the same as described above. In the following drawings, the fabricating process of the display device 10 is sequentially illustrated based on the cross sections of the first region AA1 and the second regions AA2 adjacent thereto in the first sub-pixel SPX1.

Figure 7:
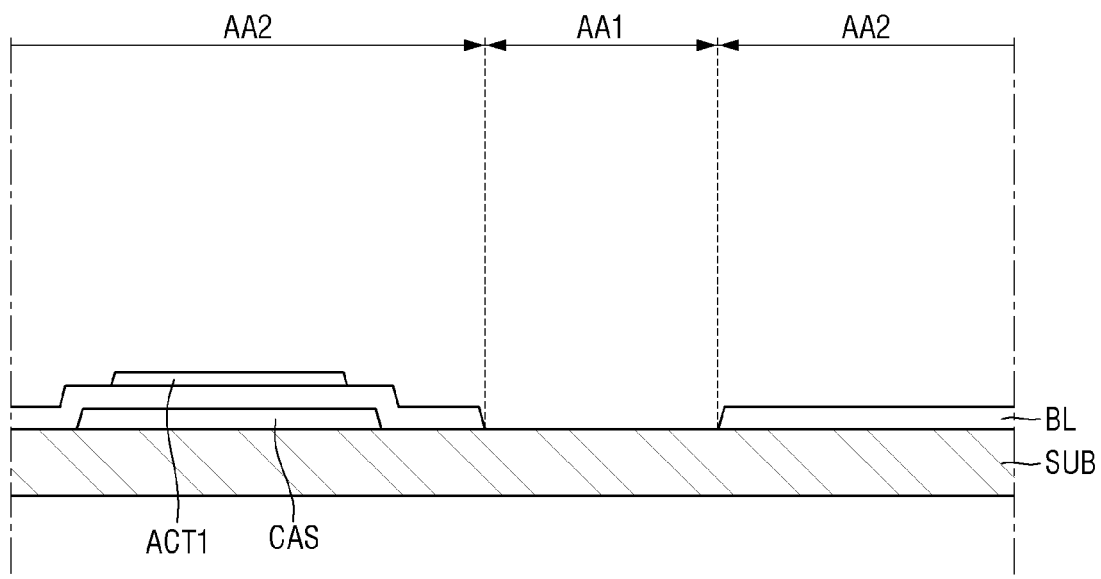
FIGS. 7 to 17 are schematic cross-sectional views sequentially illustrating a fabricating process of a display device according to an embodiment.

First, referring to FIG. 7, the first substrate SUB is prepared, and the lower metal layer CAS, the buffer layer BL, and the first active layer ACT1 are sequentially formed on the first substrate SUB. The lower metal layer CAS and the first active layer ACT1 may be formed through a process of forming a layer including a material constituting each layer and patterning the layer to have a shape. The buffer layer BL may be formed through a process of depositing a material constituting each layer on the first substrate SUB. The first substrate SUB may include the first region AA1 and the second region AA2 other than the first region AA1, and the lower metal layer CAS, the buffer layer BL, and the first active layer ACT1 may be disposed only in the second region AA2. The buffer layer BL may be disposed entirely on the first substrate SUB while opening the first region AA1.

Figure 8:
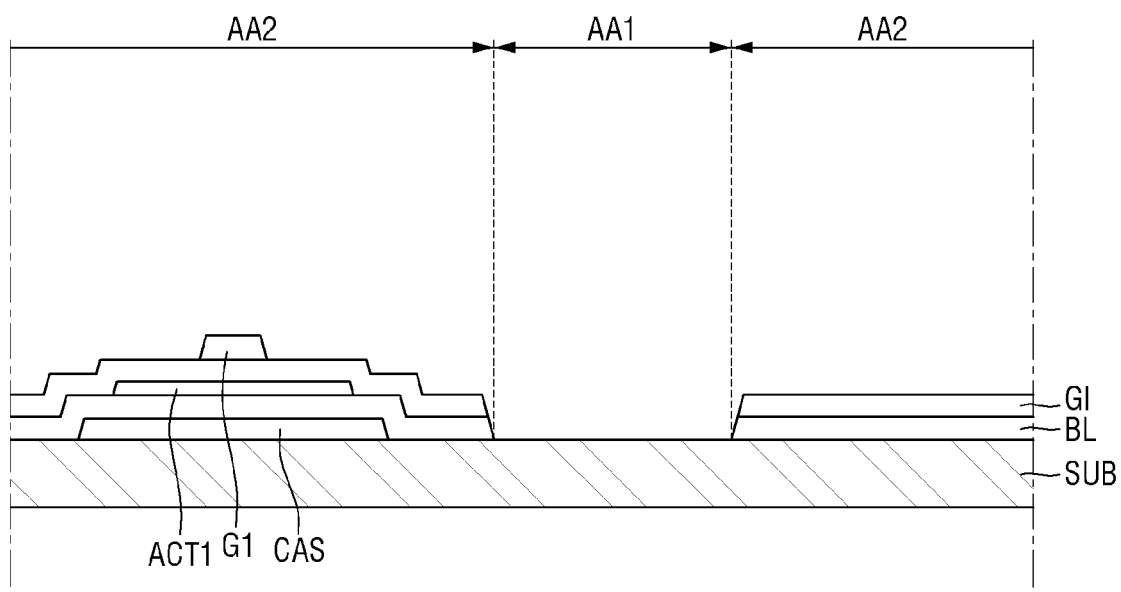
Figure 9:
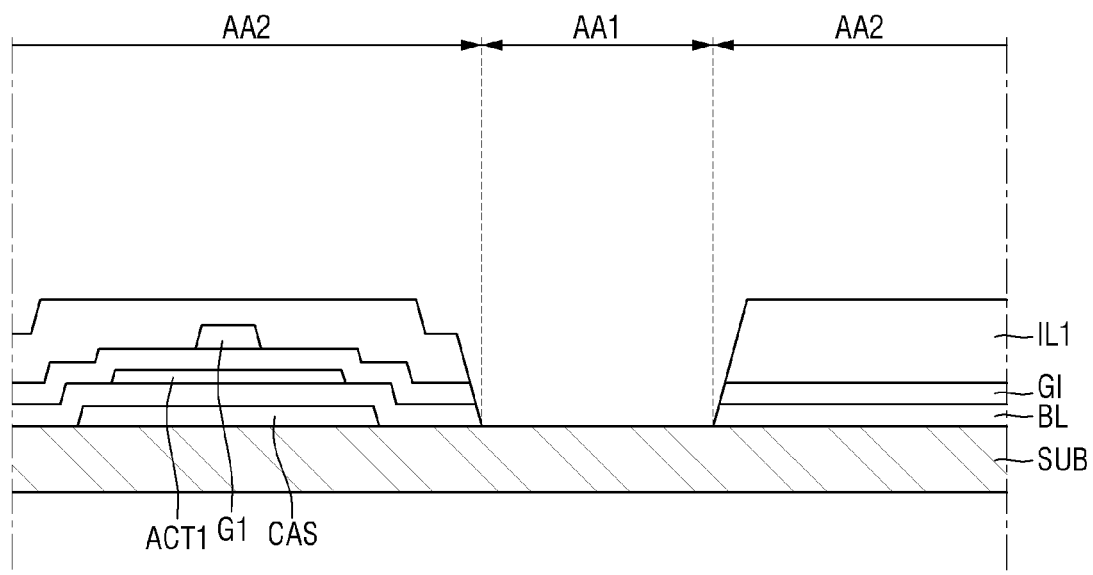

Referring to FIGS. 8 and 9, the first gate insulating layer GI, the first conductive layer, and the first interlayer insulating layer IL1 are sequentially formed on the first active layer ACT1. The first conductive layer may include the first gate electrode G1 disposed to overlap the first active layer ACT1. The first conductive layer may be formed through a process of forming a layer including a material constituting each layer and patterning the layer to have a shape. The first gate insulating layer GI and the first interlayer insulating layer IL1 may be formed through a process of depositing a material constituting each layer on the first substrate SUB. The first gate insulating layer GI, the first conductive layer, and the first interlayer insulating layer IL1 may also be disposed only in the second region AA2, and the first gate insulating layer GI and the first interlayer insulating layer IL1 may be disposed entirely over the first substrate SUB while opening the first region AA1.

Figure 10:
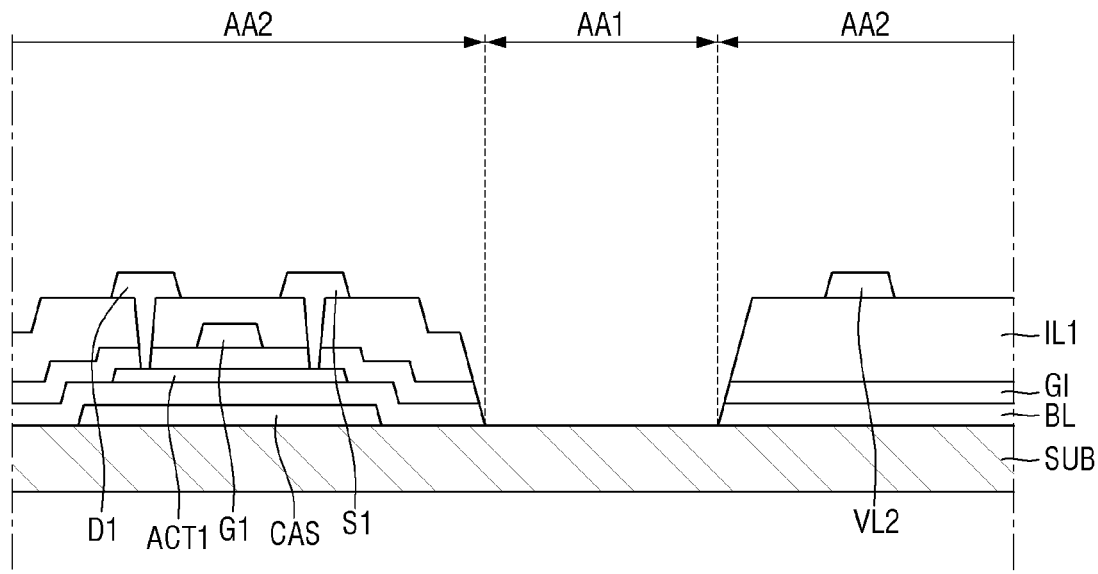
Figure 11:
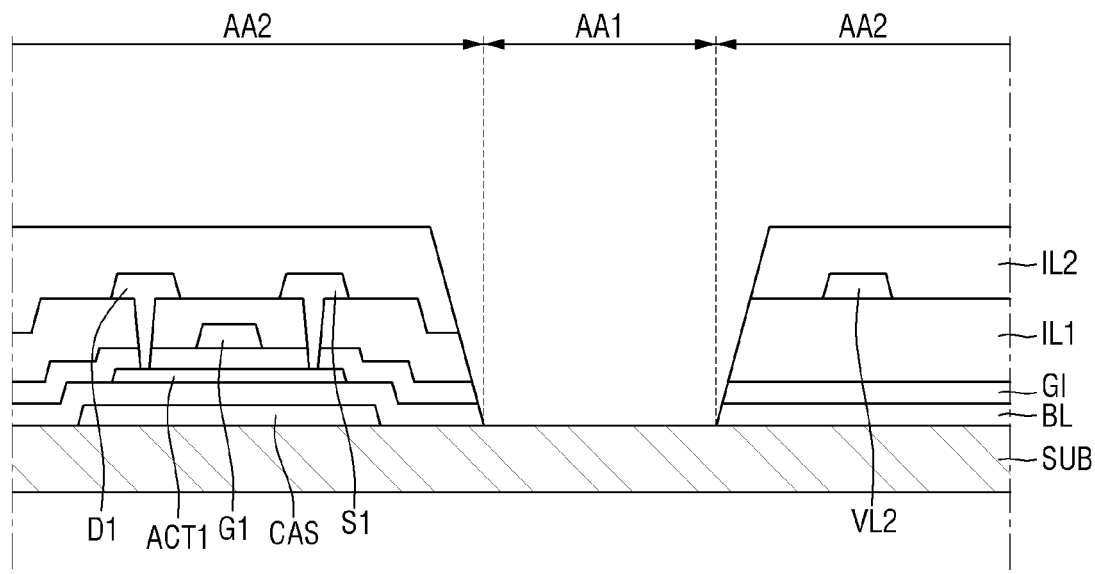

Referring to FIGS. 10 and 11, the second conductive layer and the second interlayer insulating layer IL2 are formed on the first interlayer insulating layer IL1. The method of forming the second conductive layer and the second interlayer insulating layer IL2 is the same as described above. The second conductive layer and the second interlayer insulating layer IL2 may also be disposed only in the second region AA2, and the second interlayer insulating layer IL2 may open the first region AA1.

Before forming the second conductive layer, a process of forming a contact hole penetrating the first gate insulating layer GI and the first interlayer insulating layer IL1 may be performed. In the process of forming the contact hole, a part of the first active layer ACT1 is exposed, and the first source electrode S1 and the first drain electrode D1 may be disposed in the contact hole to be in electrical contact with the first active layer ACT1.

Figure 12:
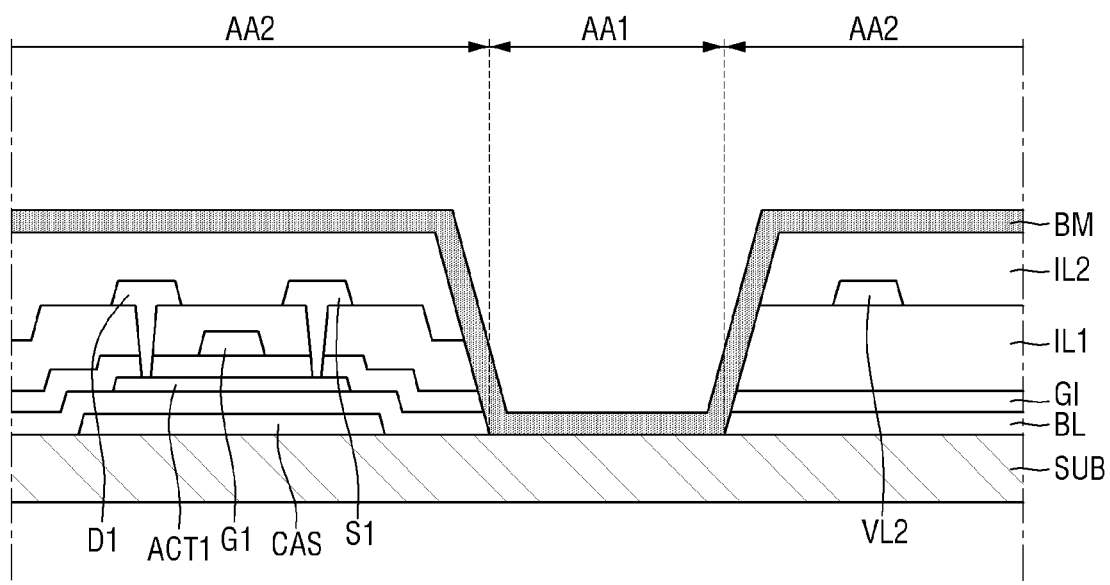

Referring to FIG. 12, the light absorbing layer BM may be formed or disposed on the first substrate SUB. The light absorbing layer BM may be formed or disposed entirely over the first substrate SUB regardless of the first region AA1 and the second region AA2, and may be disposed on or directly disposed on the first substrate SUB in the first region AA1 where the layers described above are opened. The light absorbing layer BM may be disposed on or directly disposed on the second interlayer insulating layer IL2 in the second region AA2, and may also be disposed on the inner sidewall of the first region AA1.

Figure 13:
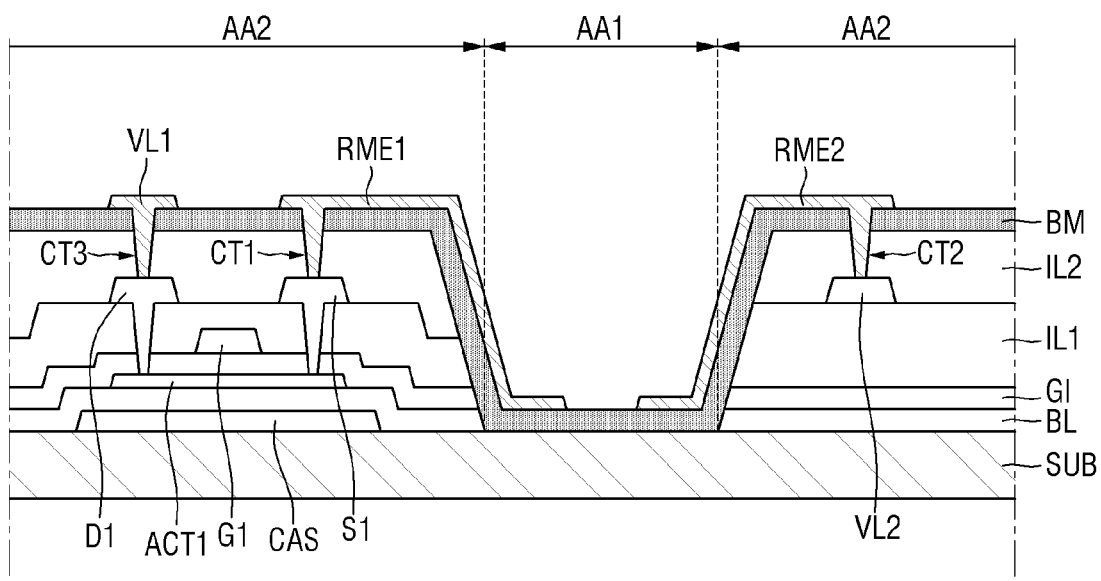
Figure 14:
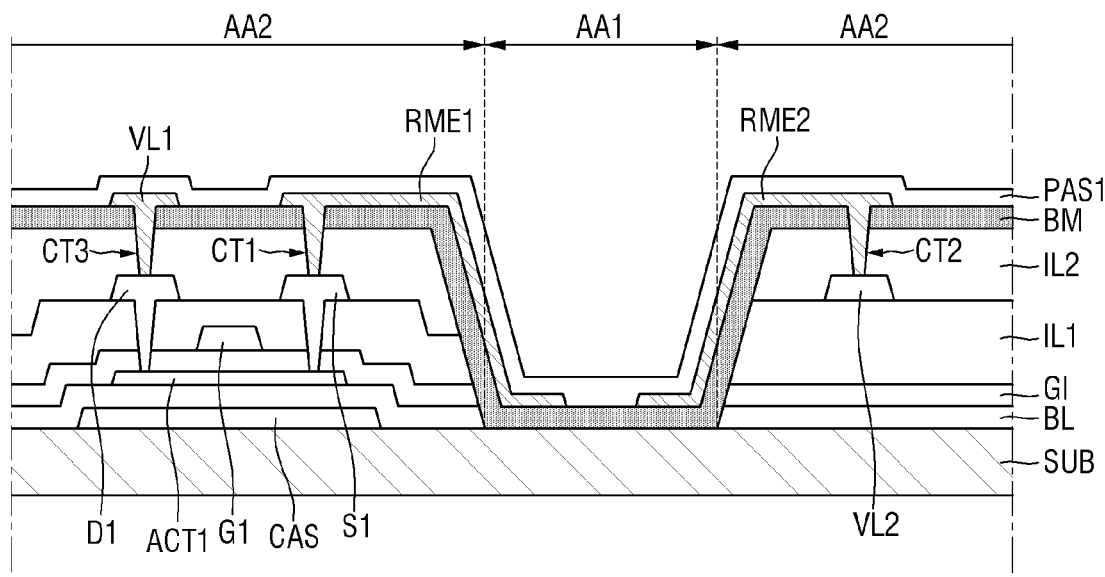

Referring to FIGS. 13 and 14, the contact holes CT1, CT2, and CT3 penetrating the light absorbing layer BM and the second interlayer insulating layer IL2 are formed, and the third conductive layer is formed on the light absorbing layer BM, and the first insulating layer PAS1 is formed on the third conductive layer. In the third conductive layer, the first voltage wire VL1 may be disposed in the second region AA2 and may be formed to be electrically connected or directly connected to the first drain electrode D1 through the third contact hole CT3. The first electrode RME1 and the second electrode RME2 may be disposed across the first region AA1 and the second region AA2, and may be formed to be electrically connected or directly connected to the first source electrode S1 and the second voltage wire VL2 through the first contact hole CT1 and the second contact hole CT2, respectively.

Figure 15:
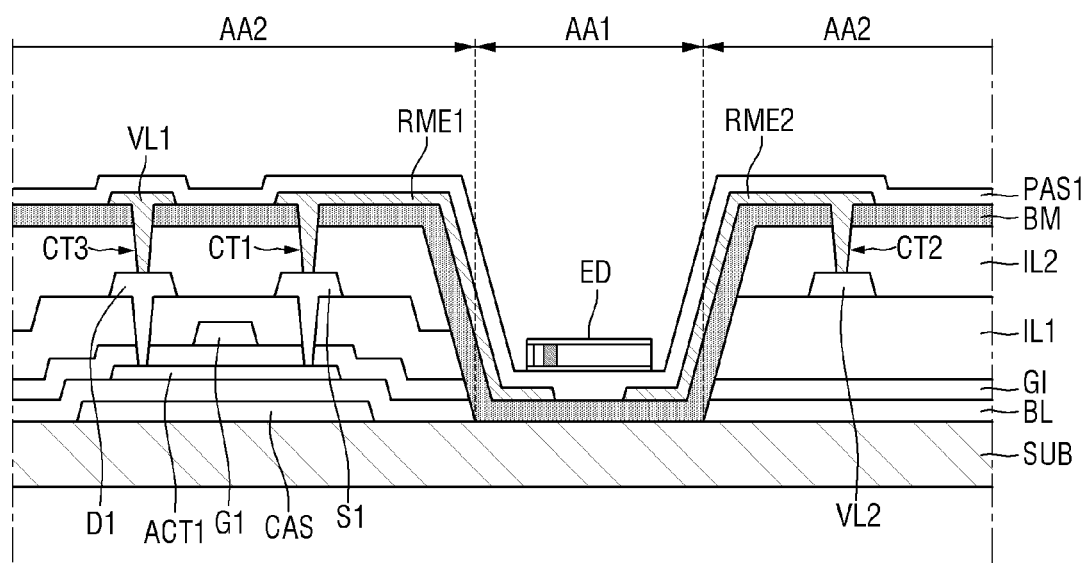

Referring to FIG. 15, the light emitting elements ED are disposed on the first insulating layer PAS1 in the first region AA1. In an embodiment, the light emitting elements ED may be prepared to be in a dispersed state in the ink, and may be sprayed onto the first region AA1 of each sub-pixel SPXn through an inkjet printing process. The bank structure formed by the buffer layer BL, the first gate insulating layer GI, the first interlayer insulating layer IL1, and the second interlayer insulating layer IL2 may prevent the ink from overflowing to the first regions AA1 of other adjacent sub-pixels SPXn. In case that the ink is sprayed onto the first region AA1, an alignment signal is applied to each of the electrodes RME1 and RME2 to generate an electric field in the first region AA1. The position and orientation direction of the light emitting elements ED dispersed in the ink are changed by the electric field, so that both ends of the light emitting elements ED may be disposed on the different electrodes RME1 and RME2.

Figure 16:
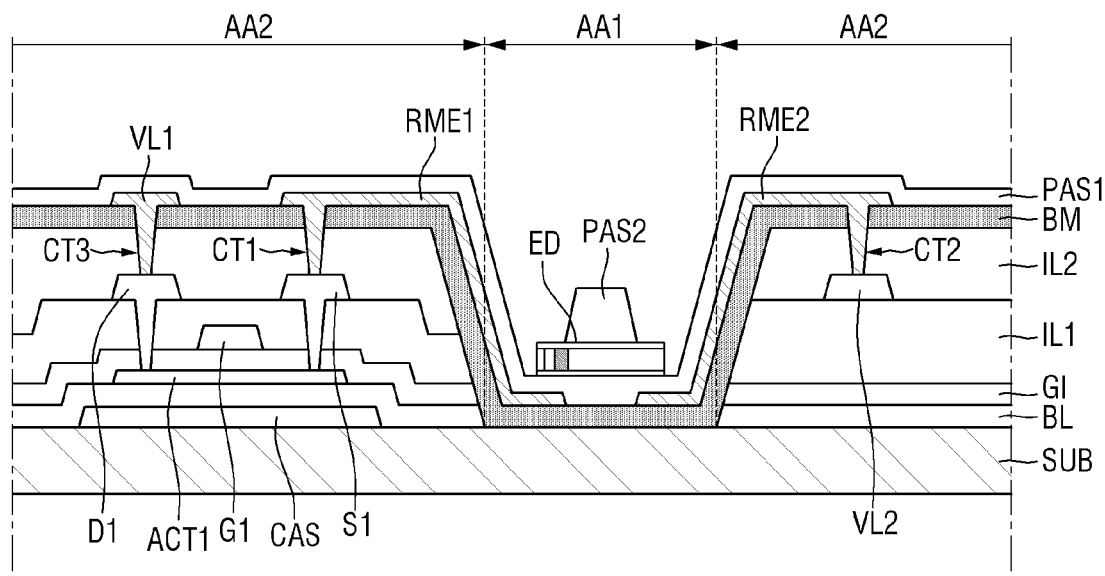

Referring to FIG. 16, the second insulating layer PAS2 is formed on the light emitting element ED. The second insulating layer PAS2 may be formed through a patterning process in which a material constituting the second insulating layer PAS2 is entirely formed on the first insulating layer PAS1 and partially removed. The material constituting the second insulating layer PAS2 is first formed to fix the light emitting elements ED, and patterned such that both ends of the light emitting elements ED are exposed to form the second insulating layer PAS2.

Figure 17:
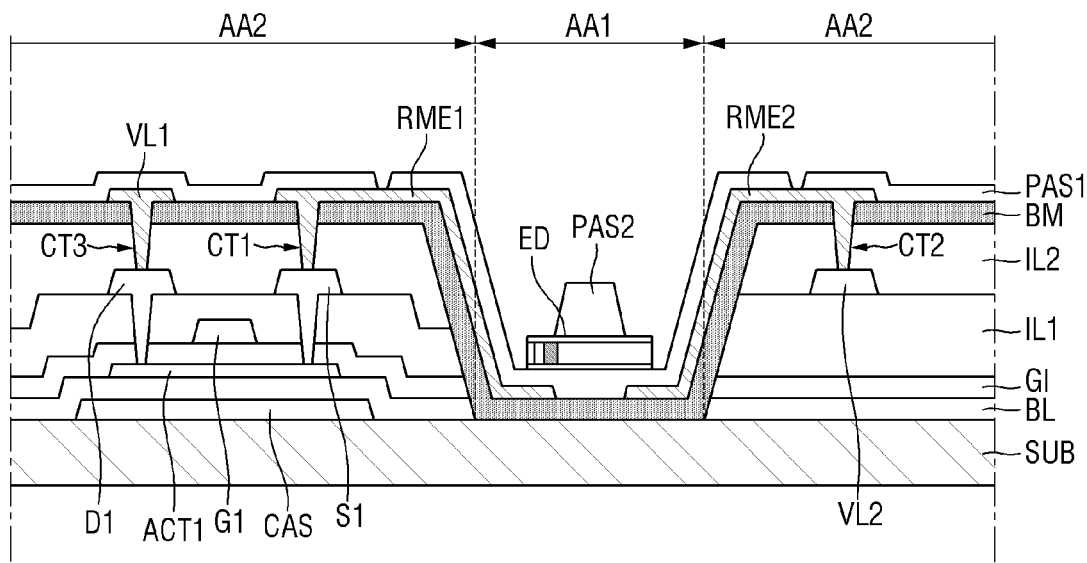

Referring to FIG. 17, the contact portions penetrating the first insulating layer PAS1 are formed to expose parts of the top surfaces of the first electrode RME1 and the second electrode RME2. This process may be performed after the second insulating layer PAS2 is formed, but is not limited thereto. In an embodiment, the contact portions penetrating the first insulating layer PAS1 may be formed prior to the process of forming the first insulating layer PAS1, for example, the process of arranging the light emitting elements ED.

Finally, although not shown in the drawings, the connection electrodes CNE may be formed on the second insulating layer PAS2 to fabricate the display device 10. The display device 10 according to an embodiment may be fabricated according to the above process sequence. The display device 10 may reduce reflection due to the external light and the internal light by forming the light absorbing layer BM entirely on the first substrate SUB before arranging the light emitting element ED.

Figure 18:
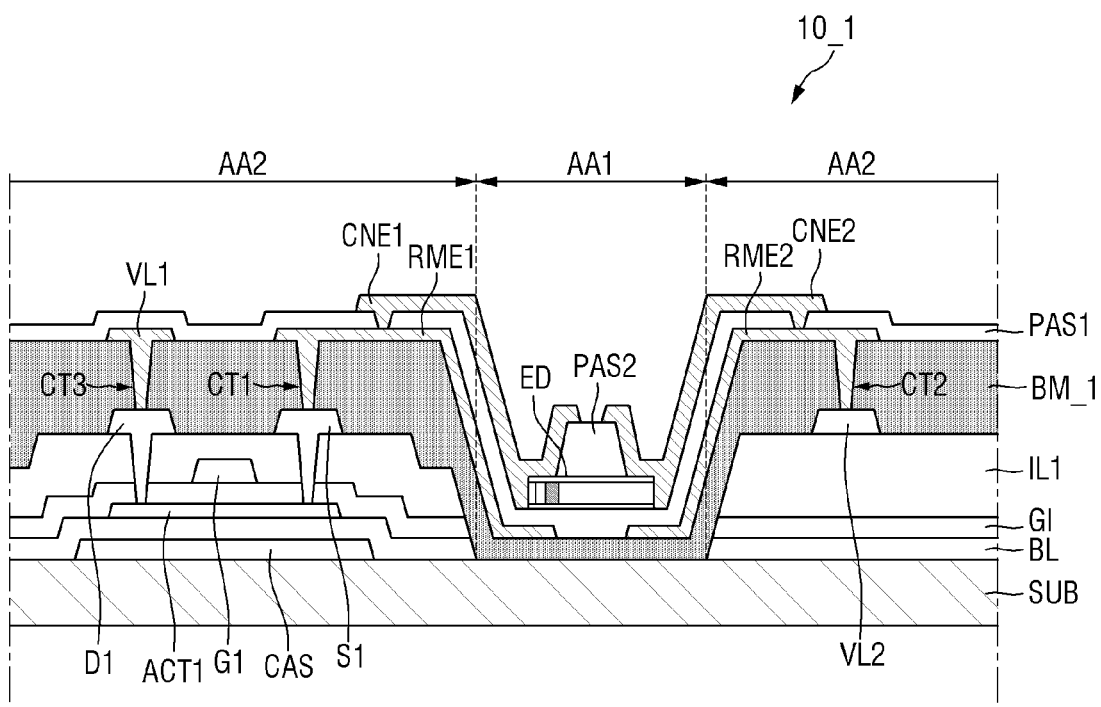
FIG. 18 is a schematic cross-sectional view of a display device according to an embodiment.

FIG. 18 is a schematic cross-sectional view of a display device according to an embodiment.

Referring to FIG. 18, in a display device 10_1 according to an embodiment, the second interlayer insulating layer IL2 may be integral with a light absorbing layer BM_1, and a light absorbing layer BM_1 may be disposed on or directly disposed on the second conductive layer and the first interlayer insulating layer IL1. As the light absorbing layer BM_1 may include an organic light blocking material used as a black matrix material, the light absorbing layer BM_1 may be used as a layer insulating the conductive layers. Accordingly, the second interlayer insulating layer IL2 may be integral with the light absorbing layer BM_1, and the light absorbing layer BM_1 may be disposed on or directly disposed on the first interlayer insulating layer IL1 and the second conductive layer.

The contact holes CT1, CT2, and CT3 may penetrate the light absorbing layer BM_1 to open a part of the second conductive layer. The first electrode RME1 may be electrically connected or directly connected to the first source electrode S1 through the first contact hole CT1 penetrating the light absorbing layer BM_1, and the second electrode RME2 may be electrically connected or directly connected to the second voltage wire VL2 through the second contact hole CT2 penetrating the light absorbing layer BM_1. The first voltage wire VL1 may be electrically connected or directly connected to the first drain electrode D1 through the third contact hole CT3 penetrating the light absorbing layer BM_1. In an embodiment, since the second interlayer insulating layer IL2 may be integral with the light absorbing layer BM_1, there is an advantage of shortening the fabricating process.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
   a substrate including a first region and a second region;
   a buffer layer disposed on the substrate and including an opening in the first region;
   a gate insulating layer disposed on the buffer layer and including an opening in the first region;
   a first conductive layer disposed on the gate insulating layer in the second region;
   a first interlayer insulating layer disposed on the first conductive layer and including an opening in the first region;
   a second conductive layer disposed on the first interlayer insulating layer in the second region;
   a light absorbing layer disposed on the second conductive layer in the first region and the second region;
   a third conductive layer disposed on the light absorbing layer and comprising:
      a first electrode and a second electrode spaced apart from each other in the first region; and
      a first voltage wire disposed on the light absorbing layer and disposed in the second region;
   a first insulating layer disposed in the first region and the second region overlapping the third conductive layer; and
   light emitting elements disposed on the first insulating layer in the first region.

2. The display device of claim 1, wherein the light absorbing layer includes a black matrix material.

3. The display device of claim 1, wherein the light absorbing layer is disposed in and directly contacts the first region on the substrate.

4. The display device of claim 3, wherein a height of a portion of the light absorbing layer disposed in the first region, measured from the substrate, is less than a height of a portion of the light absorbing layer disposed in the second region, measured from the substrate.

5. The display device of claim 3, wherein the light emitting elements overlap the light absorbing layer in a thickness direction.

6. The display device of claim 1, wherein the light absorbing layer is disposed on an inner sidewall of the first region in which the buffer layer, the gate insulating layer, and the first interlayer insulating layer are opened, and is in direct contact with the buffer layer, the gate insulating layer, and the first interlayer insulating layer.

7. The display device of claim 6, wherein each of the first electrode and the second electrode is disposed on and directly contacts the light absorbing layer on the inner sidewall of the first region of the substrate.

8. The display device of claim 7, wherein a height of a top surface of the light emitting elements is lower than a height of portions of the first electrode and the second electrode in the second region of the substrate measured from the substrate.

9. The display device of claim 1, further comprising:
   a second interlayer insulating layer disposed between the light absorbing layer and the first interlayer insulating layer,
   wherein the light absorbing layer is disposed on and directly contacts the second interlayer insulating layer.

10. The display device of claim 9, wherein
   the first electrode is directly connected to a source electrode of the second conductive layer through a first contact hole penetrating the light absorbing layer and the second interlayer insulating layer, and the second electrode is directly connected to a second voltage wire of the second conductive layer through a second contact hole penetrating the light absorbing layer and the second interlayer insulating layer.

11. The display device of claim 10, wherein the first contact hole and the second contact hole are disposed in the second region of the substrate.

12. The display device of claim 1, wherein the light absorbing layer is disposed on and directly contacts the second conductive layer and the first interlayer insulating layer.

13. The display device of claim 12, wherein
the first electrode is directly connected to a source electrode of the second conductive layer through a first contact hole penetrating the light absorbing layer, and
the second electrode is directly connected to a second voltage wire of the second conductive layer through a second contact hole penetrating the light absorbing layer.

14. The display device of claim 1, further comprising a second insulating layer disposed on the light emitting elements and exposing ends of the light emitting elements.

15. The display device of claim 14, further comprising:
a first connection electrode disposed on the first electrode and electrically contacting the light emitting elements and the first electrode; and
a second connection electrode disposed on the second electrode and electrically contacting the light emitting elements and the second electrode,
wherein the first connection electrode and the second connection electrode are disposed on the first region and the second region, respectively.

16. A display device comprising:
a substrate including a first region and a second region surrounding the first region;
a light absorbing layer disposed on the substrate and disposed in the first region and the second region;
a first electrode and a second electrode extending in a first direction on the light absorbing layer, including a portion intersecting the first region, and spaced apart from each other in a second direction in the first region;
a first insulating layer disposed on the first electrode and the second electrode; and
light emitting elements disposed on the first insulating layer in the first region, and having ends disposed on the first electrode and the second electrode,
wherein the light absorbing layer directly contacts the first electrode and the second electrode.

17. The display device of claim 16, further comprising a conductive layer disposed in the second region and overlapping the light absorbing layer.

18. The display device of claim 16, further comprising:
a first connection electrode extending in the first direction and electrically contacting the first electrode and the light emitting elements; and
a second connection electrode spaced apart from the first connection electrode in the second direction and electrically contacting the second electrode and the light emitting elements,
wherein the first connection electrode and the second connection electrode are disposed over the first region and the second region in the second direction of the first region, respectively.

19. A display device comprising:
a substrate including a first region and a second region surrounding the first region;
a light absorbing layer disposed on the substrate and disposed in the first region and the second region;
a first electrode and a second electrode extending in a first direction on the light absorbing layer, including a portion intersecting the first region, and spaced apart from each other in a second direction in the first region;
a first insulating layer disposed on the first electrode and the second electrode; and
light emitting elements disposed on the first insulating layer in the first region, and having ends disposed on the first electrode and the second electrode, wherein
the display device further comprises:
a conductive layer disposed on the second region and overlapping the light absorbing layer; and
an interlayer insulating layer disposed on the second region and overlapping the conductive layer, and
the interlayer insulating layer does not overlap the light emitting elements.

20. The display device of claim 19, further comprising:
contact holes disposed in the second region and penetrating the light absorbing layer and the interlayer insulating layer,
wherein each of the first electrode and the second electrode is directly connected to the conductive layer through one of the contact holes.

* * * * *